(12) United States Patent
Tajima

(10) Patent No.: US 12,014,794 B2
(45) Date of Patent: Jun. 18, 2024

(54) MEMORY SYSTEM

(71) Applicant: Kioxia Corporation, Tokyo (JP)

(72) Inventor: Seiichi Tajima, Nagareyama (JP)

(73) Assignee: Kioxia Corporation, Tokyo (JP)

( * ) Notice: Subject to any disclaimer, the term of this patent is extended or adjusted under 35 U.S.C. 154(b) by 1 day.

(21) Appl. No.: 17/582,184

(22) Filed: Jan. 24, 2022

(65) Prior Publication Data

US 2023/0026365 A1 Jan. 26, 2023

(30) Foreign Application Priority Data

Jul. 20, 2021 (JP) ................ 2021-119404

(51) Int. Cl.
| | |
|---|---|
| *H05K 5/00* | (2006.01) |
| *G11C 5/04* | (2006.01) |
| *G11C 5/14* | (2006.01) |
| *H05K 1/02* | (2006.01) |
| *H05K 7/20* | (2006.01) |

(52) U.S. Cl.
CPC .......... *G11C 5/04* (2013.01); *G11C 5/14* (2013.01); *H05K 1/0203* (2013.01); *H05K 5/0008* (2013.01); *H05K 7/20154* (2013.01); *H05K 7/2039* (2013.01)

(58) Field of Classification Search
CPC .......... G11C 5/04; G11C 5/14; H05K 5/0008; H05K 7/20154; G06F 1/185; G06F 1/20
USPC .................................................. 361/679.01
See application file for complete search history.

(56) References Cited

U.S. PATENT DOCUMENTS

| | | | |
|---|---|---|---|
| 9,603,280 B2 | 3/2017 | Frank et al. | |
| 10,149,399 B1 | 12/2018 | Mangay-Ayam, Jr. et al. | |
| 10,747,274 B2 | 8/2020 | Uttermann et al. | |
| 2011/0199747 A1* | 8/2011 | Ishii ............ | H05K 3/368 |
| | | | 361/784 |
| 2016/0270266 A1* | 9/2016 | Ozawa ........... | G11B 33/1406 |
| 2017/0068288 A1 | 3/2017 | Uttermann et al. | |
| 2018/0249585 A1* | 8/2018 | Yoshida .......... | H05K 5/04 |
| 2020/0154606 A1* | 5/2020 | Hur .............. | H05K 1/0203 |
| 2020/0272210 A1 | 8/2020 | Kim et al. | |
| 2021/0015006 A1 | 1/2021 | Muto | |

(Continued)

FOREIGN PATENT DOCUMENTS

| | | |
|---|---|---|
| CN | 106502317 A | 3/2017 |
| CN | 112198942 A | 1/2021 |

*Primary Examiner* — Zhengfu J Feng
(74) *Attorney, Agent, or Firm* — Oblon, McClelland, Maier & Neustadt, L.L.P.

(57) ABSTRACT

According to one embodiment, a memory system includes a first plate, an intermediate member, and a substrate. The intermediate member includes a second plate and a pair of side walls. The second plate includes a first opening, and is arranged to have a gap with respect to the first plate. The second plate includes a first face facing the first plate and a second face located on a side opposite to the first face. The pair of side walls is arranged on the second face. The substrate is placed between the pair of side walls. The substrate includes a third face on which a first non-volatile memory package and a controller package are mounted. The third face faces the second plate. The first non-volatile memory package is thermally connected to the second plate. The controller package is thermally connected to the first plate through the first opening.

29 Claims, 14 Drawing Sheets

(56) References Cited

U.S. PATENT DOCUMENTS

2021/0015007 A1    1/2021   Watanabe et al.
2021/0287959 A1*   9/2021   Kim .................... H01L 23/3677

* cited by examiner

# MEMORY SYSTEM

CROSS-REFERENCE TO RELATED APPLICATIONS

This application is based upon and claims the benefit of priority from Japanese Patent Application No. 2021-119404, filed on Jul. 20, 2021; the entire contents of which are incorporated herein by reference.

FIELD

Embodiments described herein relate generally to a memory system.

BACKGROUND

In a memory system, a non-volatile memory package containing a non-volatile memory chip and a controller package containing a controller chip, which controls the non-volatile memory chip, are placed in a housing. In general, an upper limit value of a temperature range, in which the non-volatile memory chip can correctly operate, is lower than that of the controller chip. Therefore, a structure is required, which enables heat generated in the non-volatile memory chip to be efficiently dissipated.

DETAILED DESCRIPTION

According to one embodiment, a memory system includes a first plate, an intermediate member, and a substrate. The intermediate member includes a second plate and a pair of side walls. The second plate includes a first face facing the first plate and a second face located on a side opposite to the first face. The second plate is arranged to have a gap with respect to the first plate. The second plate includes a first opening. The pair of side walls is arranged on the second face. The substrate is placed between the pair of side walls. The substrate includes a third face on which both a first non-volatile memory package containing a first non-volatile memory chip and a controller package containing a controller chip for controlling the first non-volatile memory chip are mounted. The third face faces the second plate. The first non-volatile memory package is thermally connected to the second plate. The controller package is thermally connected to the first plate through the first opening.

Hereinafter, a memory system according to embodiments will be described in detail with reference to the attached drawings. Note that the present invention is not limited to these embodiments.

First Embodiment

Figure 1:
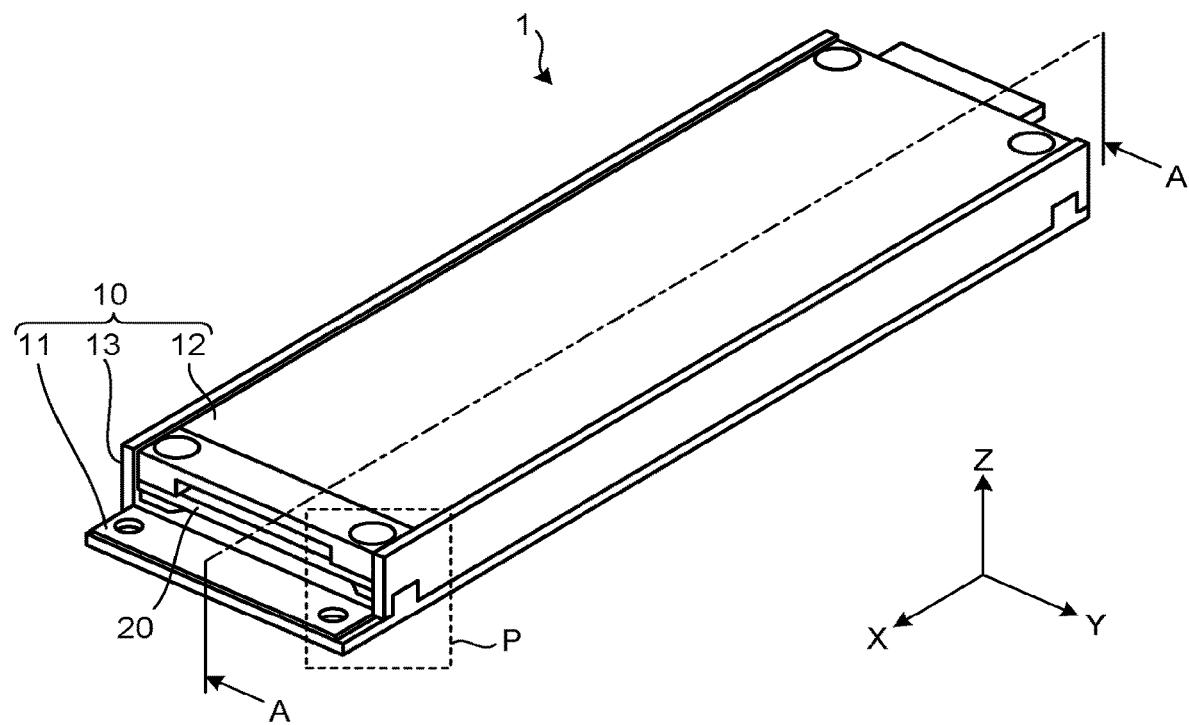
FIG. 1 is a perspective view illustrating an example of an appearance of a memory system of a first embodiment.
Figure 2:
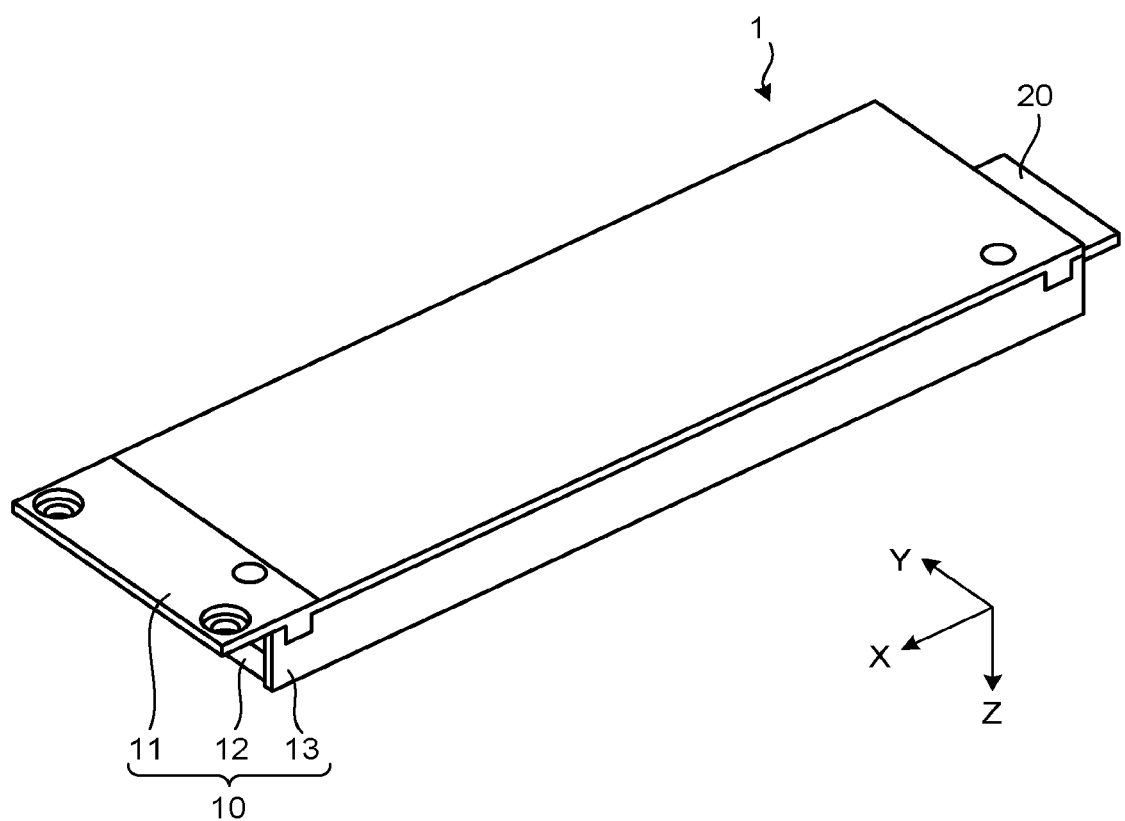
FIG. 2 is a perspective view illustrating the example of the appearance of the memory system of the first embodiment viewed from another viewpoint.
Figure 3:
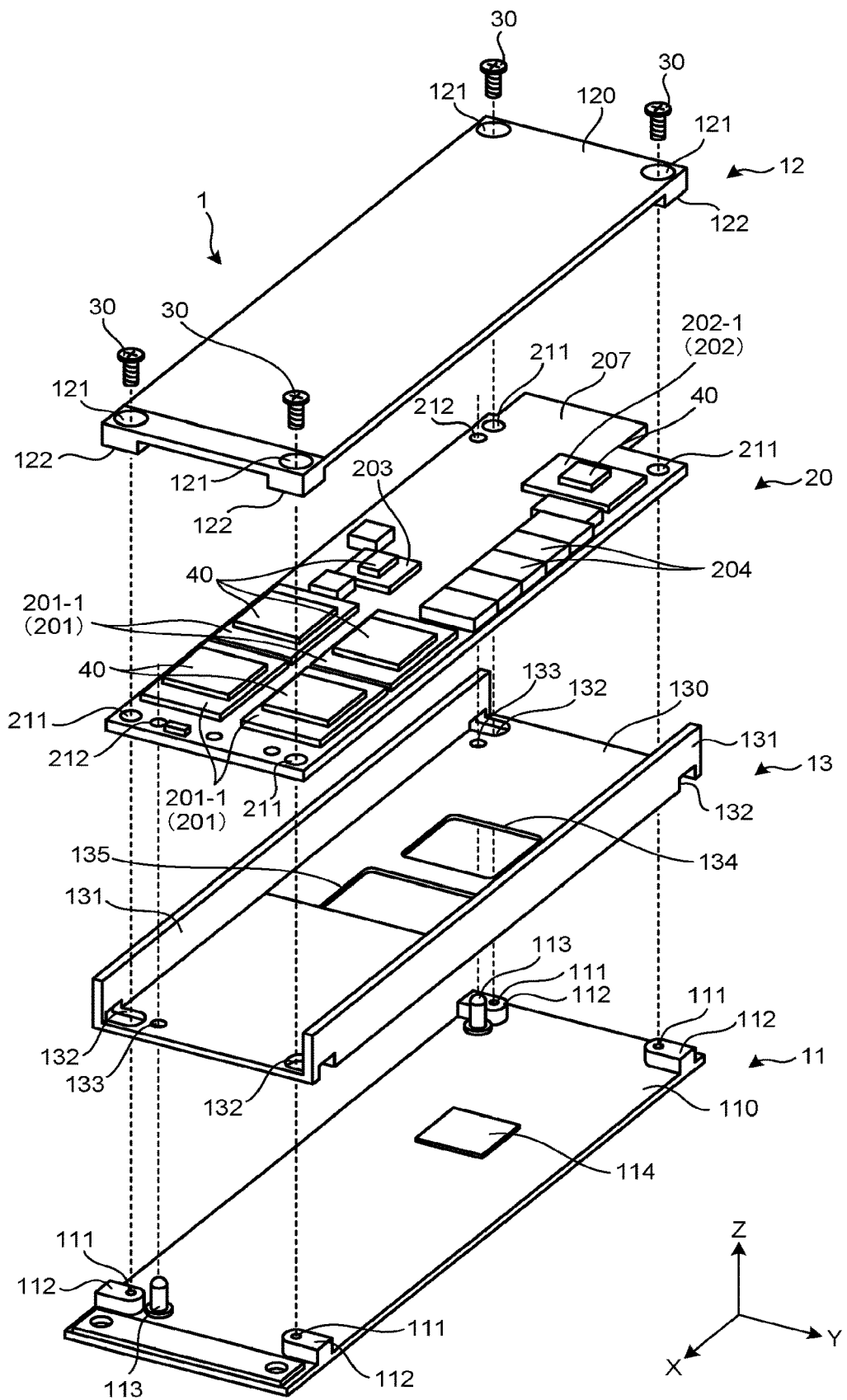
FIG. 3 is an exploded perspective view illustrating the example of the memory system of the first embodiment.
Figure 4:
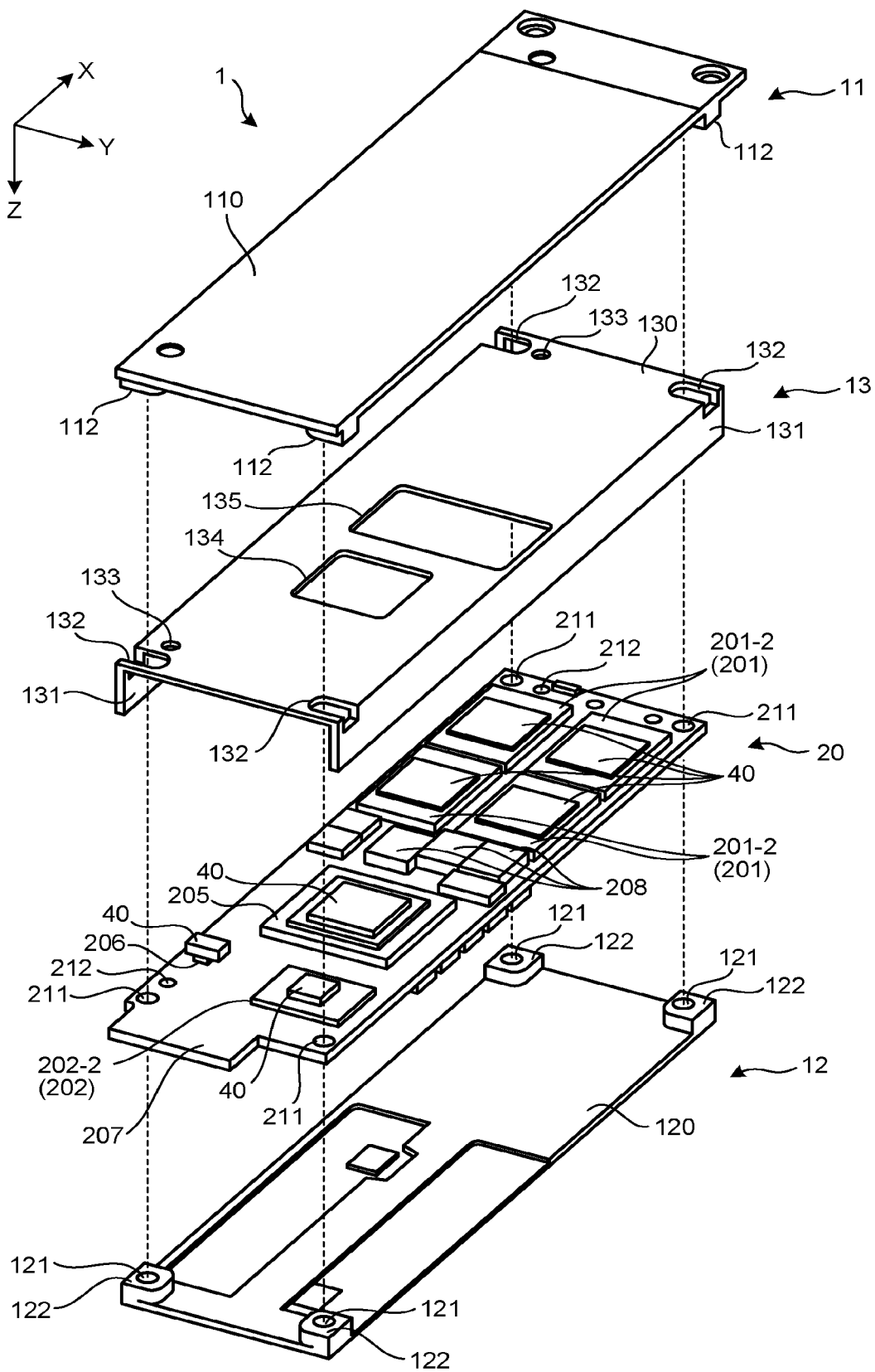
FIG. 4 is an exploded perspective view illustrating the example of the memory system of the first embodiment viewed from another viewpoint.
Figure 5:
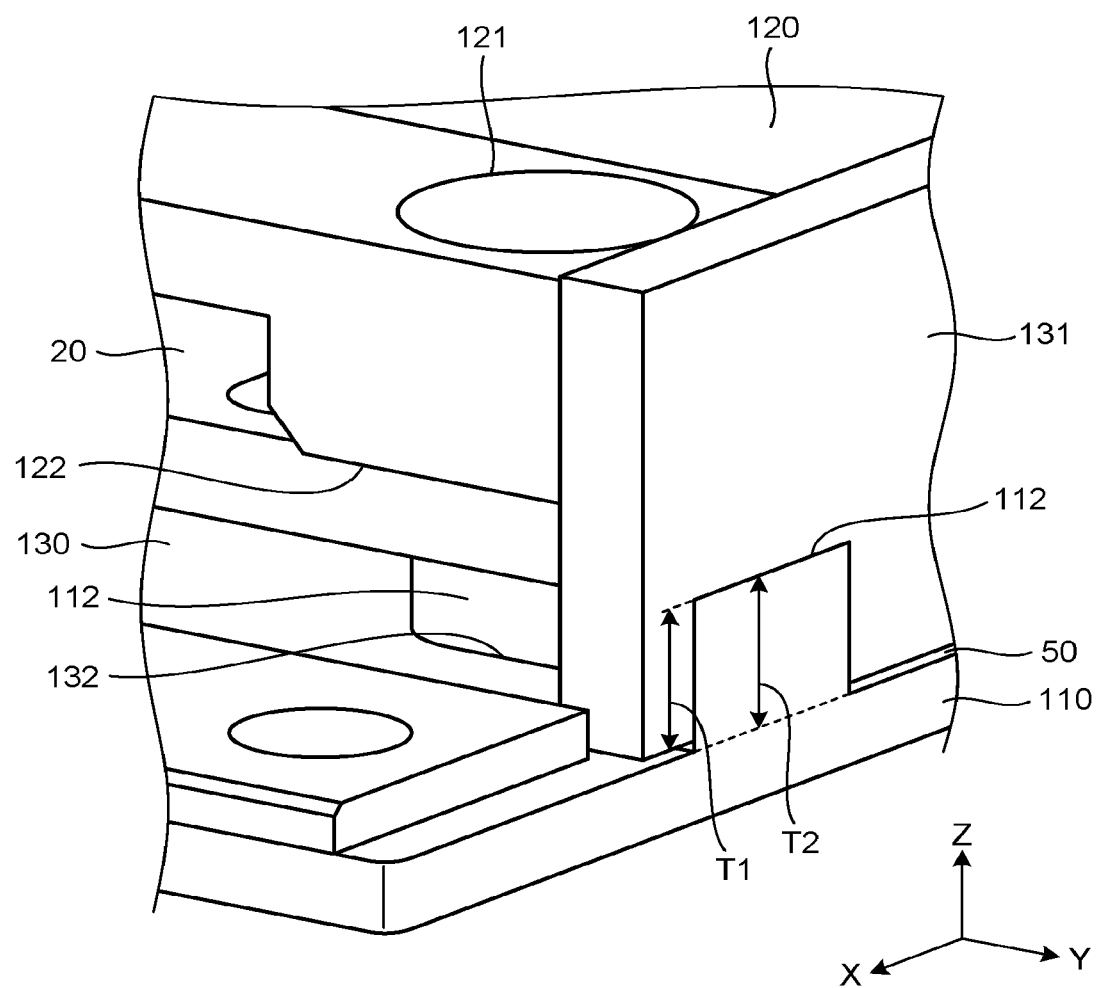
FIG. 5 is an enlarged view of a partial region of the appearance of the memory system of the first embodiment illustrated in FIG. 1.
Figure 6:
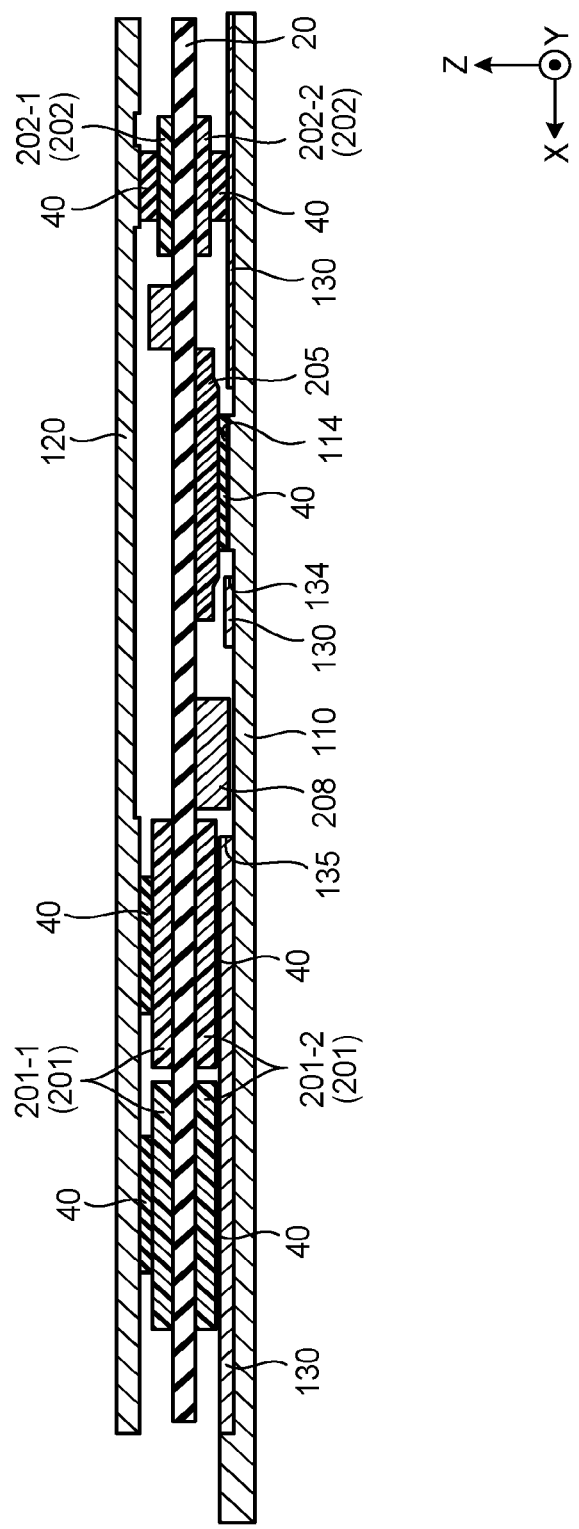
FIG. 6 is a cross-sectional view of the memory system of the first embodiment taken along a cutting line A-A illustrated in FIG. 1.

A memory system of a first embodiment will be referred to as a memory system 1. FIG. 1 is a perspective view illustrating an example of an appearance of the memory system 1 of the first embodiment. FIG. 2 is a perspective view illustrating the example of the appearance of the memory system 1 of the first embodiment viewed from another viewpoint. FIG. 3 is an exploded perspective view illustrating the example of the memory system 1 of the first embodiment. FIG. 4 is an exploded perspective view illustrating the example of the memory system 1 of the first embodiment viewed from another viewpoint. FIG. 5 is an enlarged view of a partial region P of the appearance of the memory system 1 of the first embodiment illustrated in FIG. 1. FIG. 6 is a cross-sectional view of the memory system 1 of the first embodiment taken along a cutting line A-A illustrated in FIG. 1.

Note that a case where the memory system 1 is a solid state drive (SSD) including a NAND flash memory as a non-volatile memory will be described as an example hereinafter. Hereinafter, for the sake of convenience, a longitudinal direction, a lateral direction, and a thickness direction of a rectangular top surface or bottom surface of the memory system 1 will be defined as an X direction, a Y direction, and a Z direction, respectively. Additionally, a relative positional relationship among constituent elements arranged in the Z direction, that is, a vertical relationship will be illustrated hereinafter with reference to an arrangement of the memory system 1 illustrated in FIG. 1. Moreover, a surface facing the positive side in the Z direction and a surface facing the negative side in the Z direction will be referred to as an upper surface and a lower surface, respectively, hereinafter.

As illustrated in FIG. 1, the memory system 1 has a flat rectangular parallelepiped appearance. The memory system 1 includes a housing 10 and a substrate 20. The housing 10 includes a base 11, a cover 12, and an intermediate member 13.

As illustrated in FIG. 3, the base 11 includes a first plate 110. The lower surface of the first plate 110 forms the bottom surface of the memory system 1. Screw bosses 112 protruding in the +Z direction are provided at four corners of the first plate 110. Moreover, a screw hole 111 extending in the Z direction is provided at the upper end of each of the screw bosses 112. Each of the screw holes 111 is provided to fix the cover 12 with a screw 30. The screw boss 112 is an example of a first protrusion.

The first plate 110 is provided with pins 113 protruding in the +Z direction. The pins 113 are provided for positioning the substrate 20 in the X and Y directions with respect to the base 11. Thus, a through-hole 212 through which the pin 113 penetrates is provided at a corresponding position in the substrate 20. The intermediate member 13 is placed between the substrate 20 and the base 11. A through-hole 133 through which the pin 113 penetrates is provided at a corresponding position of the intermediate member 13 to cause the pin 113 to penetrate through the through-hole 212. Note that the two pins 113 are provided in the example illustrated in FIGS. 1 to 6, but the number of provided pins 113 is not limited to two.

The intermediate member 13 includes a second plate 130 and a pair of side walls 131 arranged at both ends of the second plate 130 in the Y direction. The lower surface of the second plate 130, that is, a surface of the second plate 130 on a side close to the first plate 110 is an example of the first face. The upper surface of the second plate 130, that is, a surface on a side opposite to the first face is an example of the second face.

The pair of side walls 131 is substantially upright from the second plate 130 in the +Z direction, in other words, upright toward the side opposite to the first plate 110. The pair of side walls 131 forms a pair of side walls of the memory system 1 in the Y direction. Notched parts 132 are provided respectively at four positions of the intermediate member 13 corresponding to the four screw bosses 112 provided on the first plate 110. Each of the notched parts 132 is a hole formed by cutting out the second plate 130 inward and cutting out the side wall 131 in the +Z direction from a boundary between the second plate 130 and the side wall 131. Note that a method of forming each of the notched parts 132 is not limited thereto.

When the intermediate member 13 is stacked on the base 11 as illustrated in FIG. 5, the four screw bosses 112 are fitted into the four notched parts 132, whereby the intermediate member 13 is positioned in the X and Y directions. In the Z direction, a distance T1 from the lower surface of the second plate 130 to each of the notched parts 132 of the side walls 131 is slightly shorter than a protrusion height T2 of each of the screw bosses 112. Therefore, when the intermediate member 13 is stacked on the base 11, a partial region of the upper end surface of each of the screw bosses 112 abuts on the notched part 132 of the side wall 131, and a slight gap 50 is generated between the lower surface of the intermediate member 13 and the upper surface of the base 11. As a result, the intermediate member 13 and the base 11 are not in contact with each other at portions other than portions where the four notched parts 132 of the pair of side walls 131 and the four screw bosses 112 abut on each other. That is, the second plate 130 is placed to have the gap 50 in the Z direction with respect to the first plate 110.

Moreover, when the intermediate member 13 is stacked on the base 11, the other region including the screw hole 111 in the upper end surface of each of the screw bosses 112 is exposed to the upper side of the second plate 130 through the notched part 132 formed in the second plate 130. In addition, the cover 12 is provided with protrusions 122 at positions corresponding to the respective screw bosses 112. When the substrate 20 is placed in the intermediate member 13, the cover 12 covers the substrate 20 from above, and the cover 12 is fixed to the base 11 with each of the screws 30, the substrate 20 is sandwiched in the +Z and −Z directions between the region in the upper end surface of each of the screw bosses 112 exposed to the upper side of the second plate 130 and the lower end of the protrusion 122 of the cover 12. As a result, the substrate 20 is positioned in the Z direction inside the housing 10.

As illustrated in FIG. 3, the cover 12 includes a third plate 120 that covers the substrate 20 from a surface (that is, the upper surface of the substrate 20) on a side opposite to a surface on a side close to the first plate 110 (that is, the lower surface of the substrate 20) among the surfaces of the substrate 20. The upper surface of the third plate 120 forms the top surface of the memory system 1. The protrusions 122 protruding in the −Z direction are provided respectively at four positions of the third plate 120 corresponding to the four screw bosses 112. A through-hole 121 is provided at a position corresponding to each of the screw holes 111. The screw 30 passes through each of the through-holes 121 in the −Z direction. The inside of each of the through-holes 121 is subjected to spot-facing processing to embed the head of the screw 30.

The intermediate member 13 is stacked on the base 11. The substrate 20 is placed between the pair of side walls 131 of the intermediate member 13. The substrate 20 is covered with the cover 12 from above, and the cover 12 is fixed to the base 11 with the four screws 30. Each of the screws 30 is screwed into the screw hole 111 provided in the screw boss 112 through the protrusion 122, the substrate 20, and the intermediate member 13 from the cover 12 side. For this screwing, the substrate 20 is provided with the four through-holes 211 to allow the respective screws 30 to pass therethrough.

The base 11, the cover 12, and the intermediate member 13 forming the housing 10 are each made of materials having excellent heat dissipation properties and rigidity. For example, the base 11, the cover 12, and the intermediate member 13 are made of aluminum or an aluminum alloy. Note that the materials of the base 11, the cover 12, and the intermediate member 13 are not limited to these examples.

The substrate 20 is a printed circuit board on which multiple elements are mounted. A connector 207 to be electrically connected to a backplane placed in a host device is provided at the end in the −X direction of the substrate 20.

As illustrated in FIGS. 3 and 4, the multiple elements mounted on the substrate 20 include circuit components such as at least one non-volatile memory package 201, at least one volatile memory package 202, at least one power management integrated circuit (PMIC) 203, at least one capacitor 204, at least one controller package 205, at least one direct current to direct current (DCDC) converter 206, and at least one capacitor 208.

The non-volatile memory package 201 packages a non-volatile memory chip with a heat-resistant resin, ceramics, or the like. The non-volatile memory chip is, for example, a chip of a NAND flash memory.

The volatile memory package 202 packages a volatile memory chip with a heat-resistant resin, ceramics, or the like. The volatile memory chip is, for example, a dynamic random access memory (DRAM) chip or a static RAM (SRAM) chip.

The controller package 205 packages a controller chip that controls the non-volatile memory chip and the volatile memory chip with a heat-resistant resin, ceramics, or the like. The controller chip is configured as, for example, a system-on-a-chip (SoC).

The capacitor 204 and the capacitor 208 play a role of compensating for power supply from the host device to which the memory system 1 is connected. The PMIC 203 generates power to be supplied to the respective circuit components from power supplied at least from the host device. The DCDC converter 206 performs voltage conversion.

The number of various elements mounted on the substrate 20 may be plural. In the example illustrated in FIGS. 1 to 6, eight non-volatile memory packages 201, two volatile memory packages 202, five capacitors 204, one PMIC 203, one controller package 205, one DCDC converter 206, and three capacitors 208 are mounted on the substrate 20. Among these, four non-volatile memory packages 201, one volatile memory package 202, the five capacitors 204, and the one PMIC 203 are mounted on the upper surface of the substrate 20. The other four non-volatile memory packages 201, the other one volatile memory package 202, the one controller package 205, the one DCDC converter 206, and the three capacitors 208 are mounted on the lower surface of the substrate 20.

Regarding the elements mounted on both the upper surface and the lower surface of the substrate 20, "-1" is attached to the end of a reference sign of an element mounted on the upper surface of the substrate 20, and "-2" is attached to the end of a reference sign of an element mounted on the lower surface of the substrate 20. The lower surface of the substrate 20, that is, the surface of the substrate 20 on the side close to the first plate 110 is an example of the third face. The upper surface of the substrate 20, that is, the surface on the side opposite to the third face is an example of a fourth face. Each of the four non-volatile memory packages 201-2 is an example of the first non-volatile memory package mounted on the third face. Each of the four non-volatile memory packages 201-1 is an example of a second non-volatile memory package mounted on the fourth face.

Out of the elements mounted on the substrate 20, the non-volatile memory package 201, the volatile memory package 202, the PMIC 203, the controller package 205, and the DCDC converter 206 each generate a large amount of heat. Thermal conductive sheets 40 are provided on these elements having a large amount of heat generation. The thermal conductive sheet 40 is made of, for example, an acrylic resin or a silicone resin. The thermal conductive sheet 40 has thermal conductivity and insulating properties, and also has elasticity. The thermal conductive sheet 40 is used to thermally connect the elements and the base 11, the cover 12, or the intermediate member 13. The thermal conductive sheet 40 conducts heat generated in an element connected thereto to the base 11, the cover 12, or the intermediate member 13, thereby suppressing a temperature rise of the element. Thus, the thermal conductive sheet 40 is provided so as to come into contact with the surface of the element and the surface of the base 11, the cover 12, or the intermediate member 13.

Among the elements provided in the memory system 1, the controller package 205 generates the largest amount of heat. Therefore, there is a case where the non-volatile memory package 201 cannot be cooled sufficiently when a path through which the heat generated in the controller package 205 is dissipated and a path through which heat generated in the non-volatile memory package 201 is dissipated are common. In addition, in the non-volatile memory chip placed in the non-volatile memory package 201, an upper limit value of a temperature range in which the non-volatile memory chip can correctly operate is relatively low. Thus, for example, when the temperature of the non-volatile memory package 201 excessively increases, it is necessary to execute thermal throttling, that is, intentional suppression of the performance of the memory system 1. Therefore, it is required to efficiently dissipate the heat generated in the non-volatile memory package 201 without being affected by the heat generated in the controller package 205.

In the first embodiment, for suppressing the influence of the heat generated in the controller package 205 on the non-volatile memory package 201, the path through which the heat generated in the controller package 205 is dissipated and the path through which the heat generated in the non-volatile memory package 201 is dissipated are separated. Hereinafter, a structure configured to separate the respective paths will be described.

As illustrated in FIG. 3, an opening 134 is provided in the second plate 130 of the intermediate member 13 at a position which corresponds to the controller package 205. In addition, a protrusion 114 protruding in the +Z direction is provided on the first plate 110 at a position which corresponds to the controller package 205. Note that the opening 134 is an example of a first opening.

As illustrated in FIG. 6, the thermal conductive sheet 40 provided on the controller package 205 is in contact with the upper end of the protrusion 114 through the opening 134. Therefore, the heat generated in the controller package 205 is conducted to the base 11 through the thermal conductive sheet 40 and the protrusion 114, and is dissipated from the base 11 to the outside.

The thermal conductive sheet 40 provided on each of the four non-volatile memory packages 201-2 is in contact with the upper surface of the second plate 130 of the intermediate member 13. Therefore, part of the heat generated in the four non-volatile memory packages 201-2 is conducted to the intermediate member 13 through the four thermal conductive sheets 40 provided on the four non-volatile memory packages 201-2, and is dissipated from the pair of side walls 131 of the intermediate member 13 to the outside. In addition, part of the heat generated in the non-volatile memory package 201-2 is diffused to the second plate 130, so that a peak temperature of the non-volatile memory package 201-2 is suppressed.

The four non-volatile memory packages 201-1 are provided on the upper surface of the substrate 20 at positions opposite to the positions where the four non-volatile memory packages 201-2 are provided. The thermal conductive sheet 40 provided on each of the four non-volatile memory packages 201-1 is in contact with the lower surface of the third plate 120 of the cover 12. Therefore, part of the heat generated in the four non-volatile memory packages 201-1 is conducted to the cover 12 through the four thermal conductive sheets 40 provided on the four non-volatile memory packages 201-1, and is dissipated from the cover 12 to the outside. Part of the heat generated in the non-volatile memory package 201-1 is diffused to the entire cover 12, so that a peak temperature of the non-volatile memory package 201-1 is suppressed.

The thermal conductive sheets 40 provided on the controller package 205 is not in contact with the intermediate member 13. Further, the controller package 205 is not in contact with the intermediate member 13. In addition, as described above, the second plate 130 of the intermediate member 13 is placed to have the gap 50 with respect to the first plate 110 of the base 11. Therefore, a path from the controller package 205 to the base 11, which is the heat dissipation path of the heat generated in the controller package 205, is separated from the heat dissipation paths of the heat generated in the eight non-volatile memory packages 201. Therefore, the heat generated in the non-volatile memory package 201 can be efficiently dissipated without being affected by the heat generated in the controller package 205.

A heat dissipation path of heat generated in each of the volatile memory package 202, the PMIC 203, and the DCDC converter 206 can be designed in any manner.

In the example illustrated in FIGS. 1 to 6, the thermal conductive sheet 40 provided on the volatile memory package 202-2 is in contact with the upper surface of the second plate 130 of the intermediate member 13. Therefore, part of the heat generated in the volatile memory package 202-2 is conducted to the intermediate member 13 through the thermal conductive sheet 40 provided on the volatile memory package 202-2, and is dissipated from the pair of side walls 131 of the intermediate member 13 to the outside. In addition, part of the heat generated in the volatile memory package 202-2 is diffused to the entire second plate 130, so that a peak temperature of the volatile memory package 202-2 is suppressed.

Note that, similarly to the case of the controller package 205, an opening may be provided in the second plate 130 at a position corresponding to the volatile memory package 202-2 such that the volatile memory package 202-2 is thermally connected to the first plate 110 via the thermal conductive sheet 40 through the opening.

The volatile memory package 202-1 is provided on the upper surface of the substrate 20 at a position opposite to the position where the volatile memory package 202-2 is provided. The thermal conductive sheet 40 provided on the volatile memory package 202-1 is in contact with the lower surface of the third plate 120 of the cover 12. Therefore, part of the heat generated in the volatile memory package 202-1 is conducted to the cover 12 through the thermal conductive sheet 40 provided on the volatile memory package 202-1, and is dissipated from the cover 12 to the outside. Part of the heat generated in the volatile memory package 202-1 is diffused to the entire cover 12, so that a peak temperature of the volatile memory package 202-1 is suppressed.

The thermal conductive sheet 40 provided on the DCDC converter 206 is in contact with the upper surface of the second plate 130 of the intermediate member 13. Therefore, part of the heat generated in the DCDC converter 206 is conducted to the intermediate member 13 through the thermal conductive sheet 40, and is dissipated from the pair of side walls 131 of the intermediate member 13 to the outside. In addition, part of the heat generated in the DCDC converter 206 is diffused to the entire second plate 130, so that a peak temperature of the DCDC converter 206 is suppressed.

The thermal conductive sheet 40 provided on the PMIC 203 is in contact with the lower surface of the third plate 120 of the cover 12. Therefore, the heat generated in the PMIC 203 is conducted to the cover 12 through the thermal conductive sheet 40 provided on the PMIC 203, and is dissipated from the cover 12 to the outside.

That is, in the example illustrated in FIGS. 1 to 6, the heat dissipation paths of the heat generated in the volatile memory package 202, the DCDC converter 206, and the PMIC 203 are common to the heat dissipation path of heat generated in the non-volatile memory package 201. That is, those heat dissipation paths are separated from the heat dissipation path of the heat generated in the controller package 205. Therefore, the heat generated in the volatile memory package 202, the DCDC converter 206, and the PMIC 203 is efficiently dissipated without being affected by the heat generated in the controller package 205.

Note that, in the example illustrated in FIGS. 1 to 6, the second plate 130 of the intermediate member 13 is provided with an opening 135 in addition to the opening 134. The opening 135 prevents the three capacitors 208 provided at corresponding positions on the lower surface of the substrate 20 from interfering with the intermediate member 13.

In this manner, according to the first embodiment, the second plate 130 of the intermediate member 13 is placed to have the gap 50 in the Z direction with respect to the first plate 110. The second plate 130 is provided with the opening 134. The substrate 20 on which the non-volatile memory package 201-2 and the controller package 205 are mounted on the lower surface is placed between the pair of side walls 131 of the intermediate member 13. The non-volatile memory package 201-2 is thermally connected to the second plate 130 via the thermal conductive sheet 40. The controller package 205 is thermally connected to the first plate 110 via the thermal conductive sheet 40 through the opening 134.

The heat dissipation path of the heat generated in the non-volatile memory package 201-2 and the heat dissipation path of the heat generated in the controller package 205 are separated. Therefore, the heat generated in the non-volatile memory package 201-2 can be efficiently dissipated.

In addition, the notched part 132 is provided in each side wall of the pair of side walls 131 of the intermediate member 13. The first plate 110 is provided with the four screw bosses 112. The first plate 110 and the intermediate member 13 abut on each other by the notched parts 132 provided on the pair of side walls 131 and the four screw bosses 112.

Therefore, the gap 50 is provided between the second plate 130 and the first plate 110 of the intermediate member 13 in the Z direction.

In addition, the non-volatile memory package 201-1 is mounted on the upper surface of the substrate 20 according to the first embodiment. The non-volatile memory package 201-1 is thermally connected to the third plate 120 of the cover 12 via the thermal conductive sheet 40.

Therefore, the heat generated in the non-volatile memory package 201-1 can be efficiently dissipated since the heat dissipation path of the heat generated in the non-volatile memory package 201-1 and the heat dissipation path of the heat generated in the controller package 205 are separated.

In addition, according to the first embodiment, the non-volatile memory package 201-1 is mounted at the position opposite to the position of the lower surface of the substrate 20 on which the non-volatile memory package 201-2 is mounted, on the upper surface of the substrate 20.

Therefore, part of the heat generated in the non-volatile memory package 201-2 can be conducted to the cover 12 via the substrate 20, the non-volatile memory package 201-1, and the thermal conductive sheet 40, and can be dissipated from the cover 12. As a result, the heat generated in the non-volatile memory packages 201-1 and 201-2 can be dissipated more efficiently.

Note that the lower surface of the first plate 110 of the base 11 functions as a heat dissipating surface from which the heat generated in the controller package 205 is dissipated to the outside. Additionally, in the first embodiment, the area of the lower surface of the first plate 110 of the base 11 is relatively large. Therefore, according to the first embodiment, it is possible to efficiently dissipate the heat generated in the controller package 205.

Second Embodiment

Figure 7:
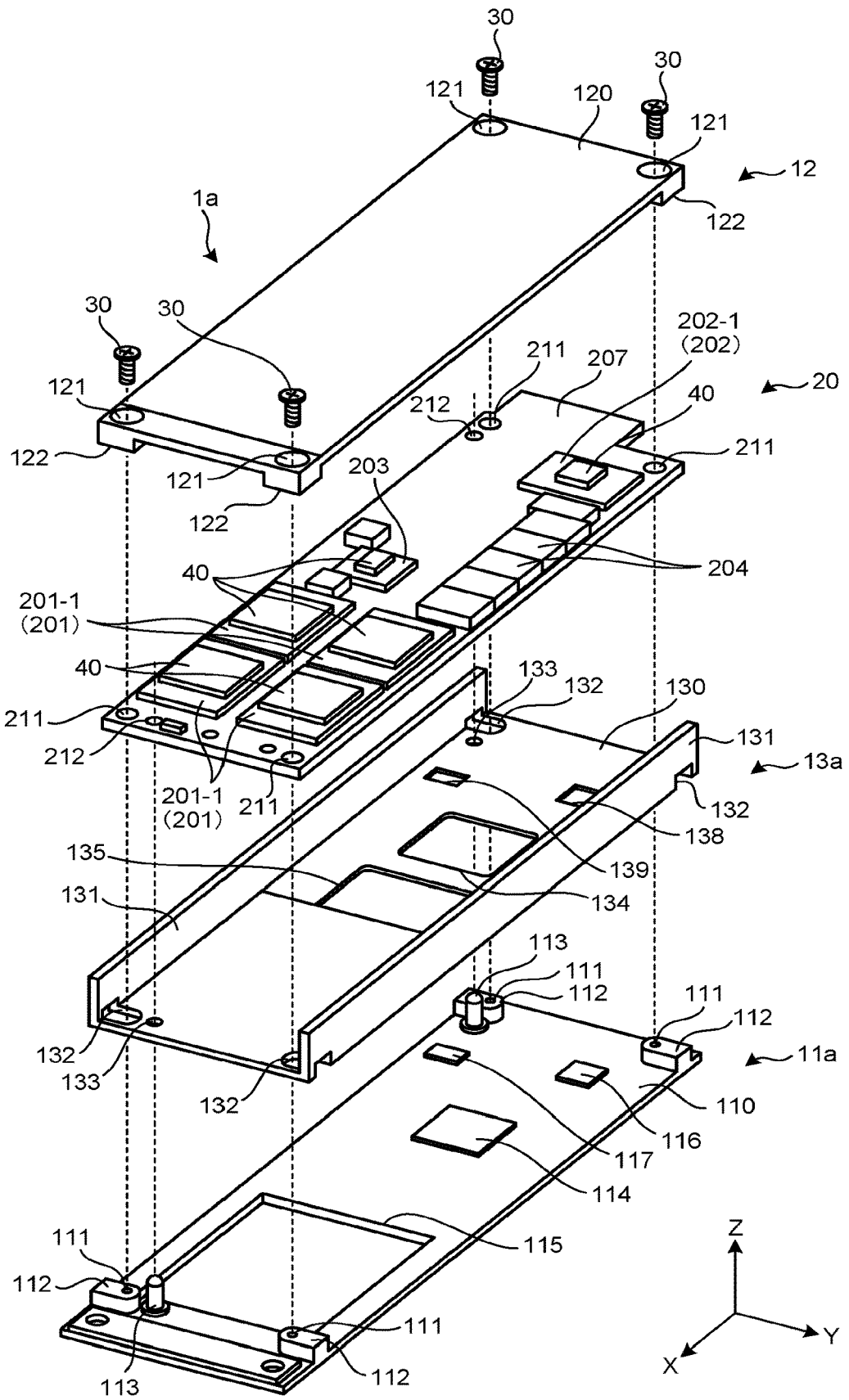
FIG. 7 is an exploded perspective view illustrating an example of a memory system of a second embodiment.
Figure 8:
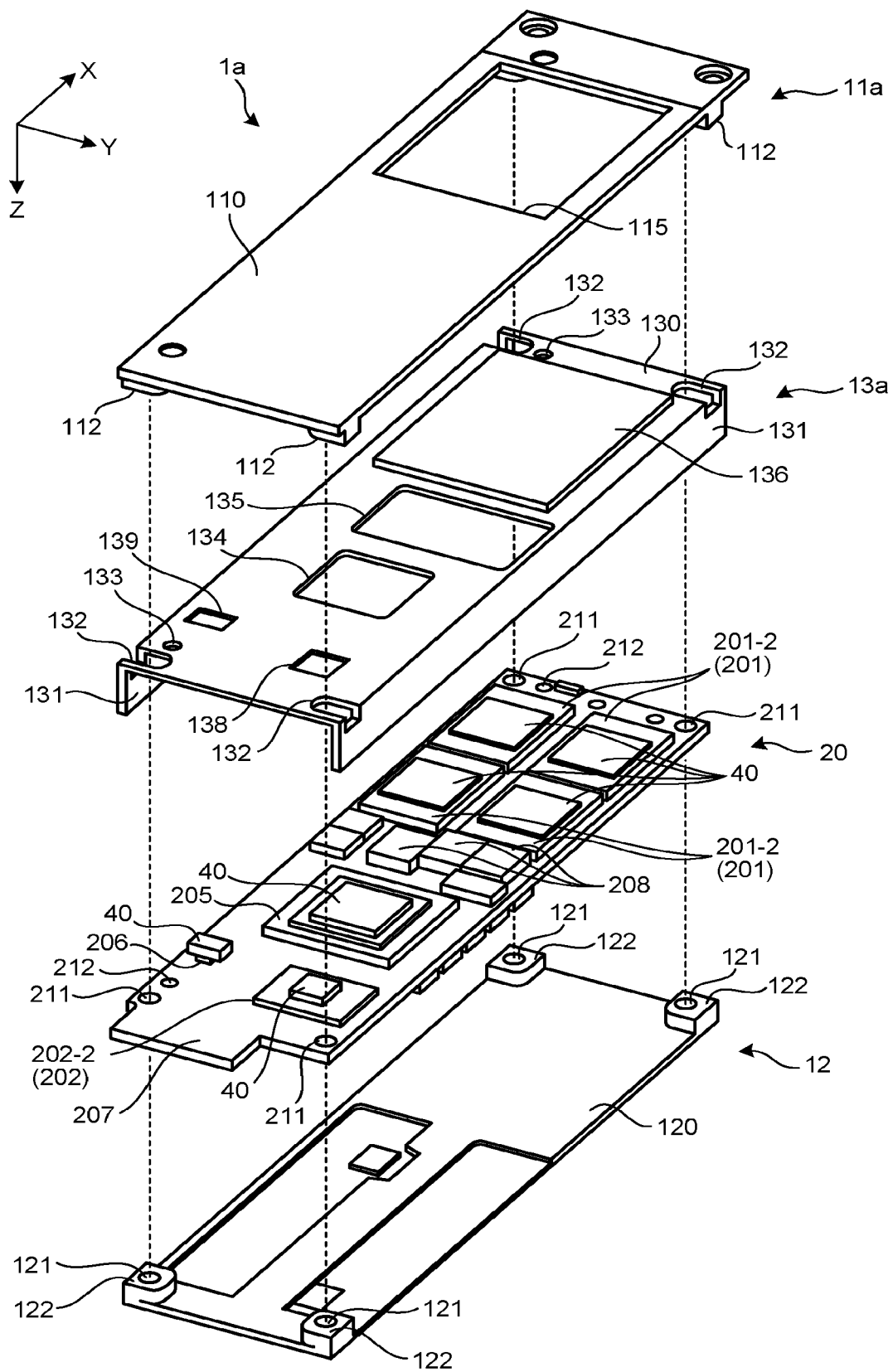
FIG. 8 is an exploded perspective view illustrating the example of the memory system of the second embodiment viewed from another viewpoint.
Figure 9:
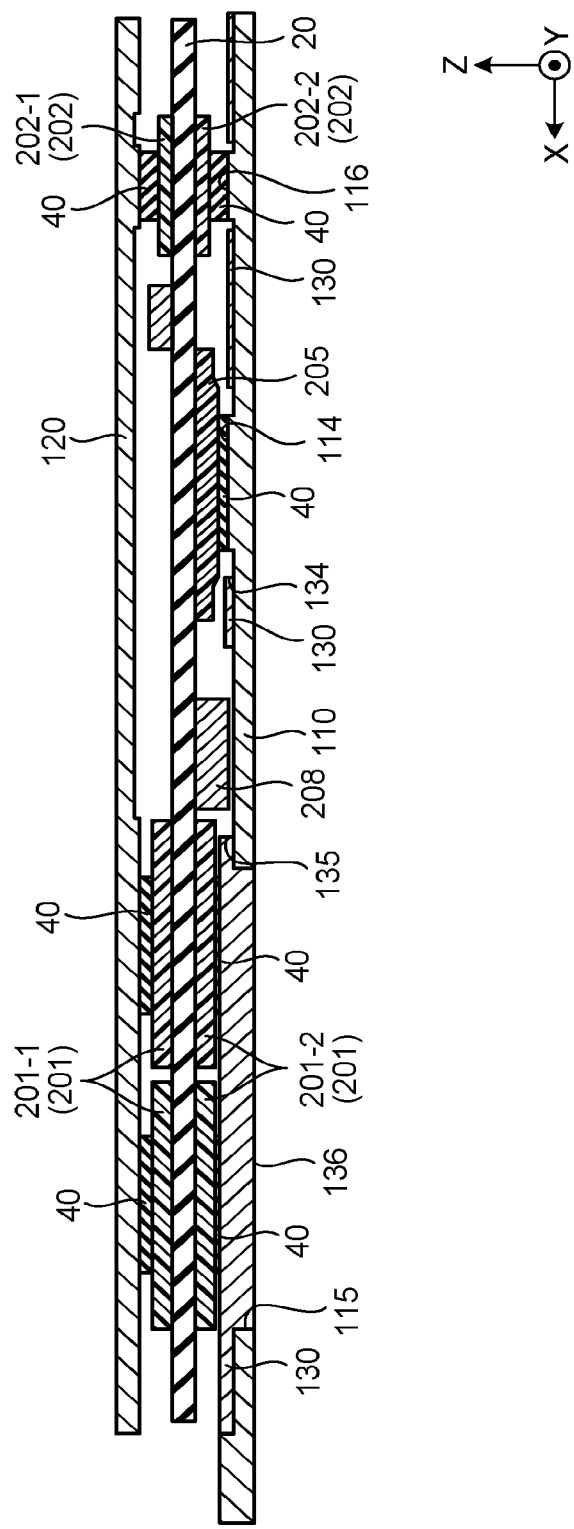
FIG. 9 is a cross-sectional view of the memory system of the second embodiment taken along the same cutting line as the cutting line A-A illustrated in FIG. 1.

A memory system of a second embodiment will be referred to as a memory system 1a. A base of the memory system 1a will be referred to as a base 11a. An intermediate member of the memory system 1a will be referred to as an intermediate member 13a. FIG. 7 is an exploded perspective view illustrating an example of the memory system 1a of the second embodiment. FIG. 8 is an exploded perspective view illustrating the example of the memory system 1a of the second embodiment viewed from another viewpoint. FIG. 9 is a cross-sectional view of the memory system 1a of the second embodiment taken along the same cutting line as the cutting line A-A illustrated in FIG. 1. Note that the same constituent elements as those of the first embodiment will be denoted by the same reference signs, and the description thereof will be omitted.

In the first embodiment described above, the memory system 1 is configured such that the heat generated in the non-volatile memory package 201 is diffused to the entire second plate 130 and is dissipated from the pair of side walls 131 or the cover 12 to the outside. On the other hand, in the second embodiment, the memory system 1a is configured such that heat generated in the non-volatile memory package 201 can be also dissipated from part of the lower surface of the second plate 130 of the intermediate member 13a to the outside.

Specifically, as illustrated in FIG. 8, a protrusion 136 protruding in the —Z direction is provided on the second plate 130 of the intermediate member 13a at a position which corresponds to the four non-volatile memory packages 201-2. Further, an opening 115 is provided in the base 11a corresponding to the protrusion 136. Dimensions of the opening 115 in the X and Y directions are slightly larger than dimensions of the protrusion 136 in the X and Y directions. In addition, a protrusion height of the protrusion 136 substantially corresponds to a sum of the thickness of the first plate 110 and an interval of the gap 50. Note that the opening 115 is an example of a second opening, and the protrusion 136 is an example of a second protrusion.

Therefore, as illustrated in FIG. 9, when the intermediate member 13a is stacked on the base 11a, the protrusion 136 is fitted into the opening 115 in a state where a side surface of the protrusion 136 is not in contact with an inner wall of the opening 115. The surface of the lower end of the protrusion 136 is substantially flush with the lower surface of the first plate 110. Therefore, heat generated in the four non-volatile memory packages 201-2 is conducted to the second plate 130 of the intermediate member 13a through the four thermal conductive sheets 40 provided on the four non-volatile memory packages 201-2, and is dissipated from the protrusion 136 to the outside.

In this manner, the opening 115 is provided in part of the base 11a, and the protrusion 136, that is, part of the intermediate member 13a is exposed to the outside through the opening 115. As a result, the area of a heat dissipating surface that dissipates the heat generated in the non-volatile memory package 201 to the outside is increased by the area of the lower end of the protrusion 136 as compared with the first embodiment. As a result, the heat generated in non-volatile memory package 201 can be dissipated more efficiently.

The memory system 1a is to be electrically connected to a backplane placed in a host device by the connector 207, similarly to a memory system of another embodiment. The host device is provided with a blower. The surface of the housing 10 of the memory system 1a is exposed to wind generated by the blower and is cooled by the wind. In the second embodiment, the lower end surface of the protrusion 136 is substantially flush with the lower surface of the first plate 110, that is, a bottom surface of the housing 10. The surface of the protrusion 136 is exposed to the wind similarly to the bottom surface of the housing 10 accordingly. Therefore, the amount of heat dissipation from the lower end surface of the protrusion 136 to the outside can be increased. That is, the heat generated in the non-volatile memory package 201 can be more efficiently dissipated since the lower end surface of the protrusion 136 is made substantially flush with the lower surface of the first plate 110.

Note that the lower end surface of the protrusion 136 is not necessarily flush with the lower surface of the first plate 110. For example, the intermediate member 13a is not necessarily provided with the protrusion 136. A structure of the lower surface of the intermediate member 13a can be freely designed as long as part of the intermediate member 13a is exposed to the outside through the opening 115 and the intermediate member 13a and the base 11a are not in contact with each other at portions other than the four screw bosses 112.

In the example illustrated in FIGS. 7 to 9, a heat dissipation path of heat generated in the volatile memory package 202-2 and a heat dissipation path of heat generated in the DCDC converter 206 are different from the respective heat dissipation paths in the first embodiment.

Specifically, as illustrated in FIGS. 7 and 8, an opening 138 is provided in the second plate 130 of the intermediate member 13a at a position which corresponds to the volatile memory package 202-2. In addition, as illustrated in FIG. 7, a protrusion 116 protruding in the +Z direction is provided on the first plate 110 of the base 11a at a position which corresponds to the volatile memory package 202-2. The thermal conductive sheet 40 provided on the volatile memory package 202-2 is in contact with the upper end of the protrusion 116 through the opening 138. Therefore, the heat generated in the volatile memory package 202-2 is conducted to the base 11a through the thermal conductive sheet 40 and the protrusion 116, and is dissipated from the base 11a to the outside.

In addition, an opening 139 is provided in the second plate 130 of the intermediate member 13a at a position which corresponds to the DCDC converter 206, as illustrated in FIGS. 7 and 8. In addition, a protrusion 117 protruding in the +Z direction is provided on the first plate 110 of the base 11a at a position which corresponds to the DCDC converter 206, as illustrated in FIG. 7. The thermal conductive sheet 40 provided on the DCDC converter 206 is in contact with the upper end of the protrusion 117 through the opening 139. Therefore, the heat generated in the DCDC converter 206 is conducted to the base 11a through the thermal conductive sheet 40 and the protrusion 117, and is dissipated from the base 11a to the outside.

Note that one or both of the heat dissipation path of the heat generated in the volatile memory package 202-2 and the heat dissipation path of the heat generated in the DCDC converter 206 may be configured to be the same as each of the heat dissipation paths in the first embodiment.

In this manner, according to the second embodiment, the opening 115 is provided in the first plate 110 at the position which corresponds to the non-volatile memory package 201-2.

Therefore, the heat generated in the non-volatile memory package 201-2 can also be dissipated from the lower surface of the second plate 130. The heat dissipation path of the heat generated in the non-volatile memory package 201-2 is newly added, so that the heat generated in the non-volatile memory package 201-2 can be dissipated more efficiently.

In addition, the protrusion 136 is provided on the lower surface of the second plate 130 at the position which corresponds to the non-volatile memory package 201-2. The lower end surface of the protrusion 136 protrudes through the opening 115 and is substantially flush with the lower surface of the first plate 110 according to the second embodiment.

Therefore, the lower end surface of the protrusion 136 can be exposed to the wind on the outside. As a result, the heat generated in the non-volatile memory package 201-2 can be dissipated more efficiently.

Third Embodiment

A memory system of a third embodiment will be referred to as a memory system 1b. An intermediate member of the memory system 1b will be referred to as an intermediate member 13b. A cover of the memory system 1b will be referred to as a cover 12b.

Figure 10:
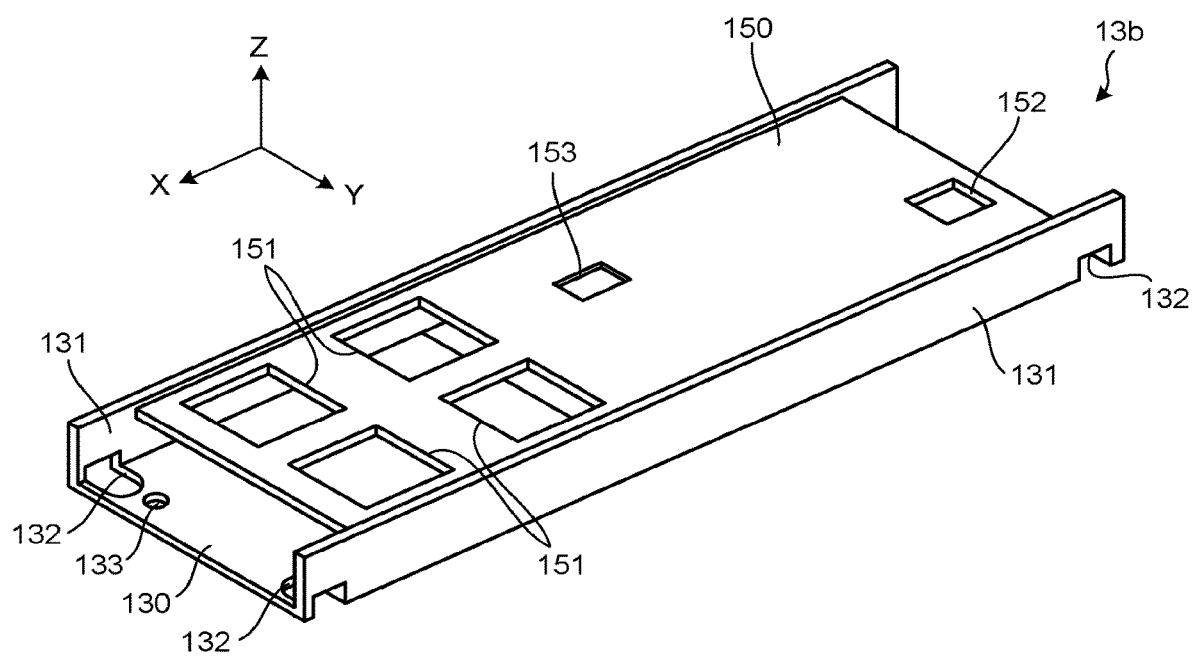
FIG. 10 is a perspective view illustrating an example of an appearance of an intermediate member of a third embodiment.
Figure 11:
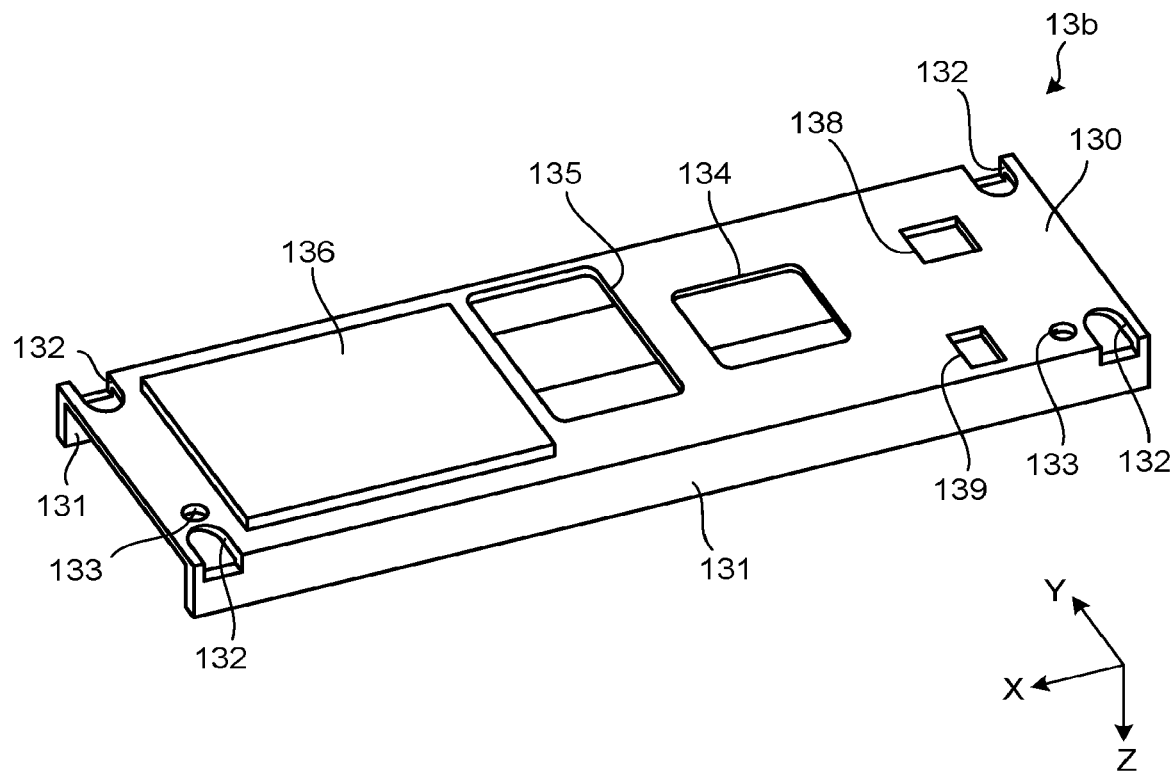
FIG. 11 is a perspective view illustrating the example of the appearance of the intermediate member of the third embodiment viewed from another viewpoint.
Figure 12:
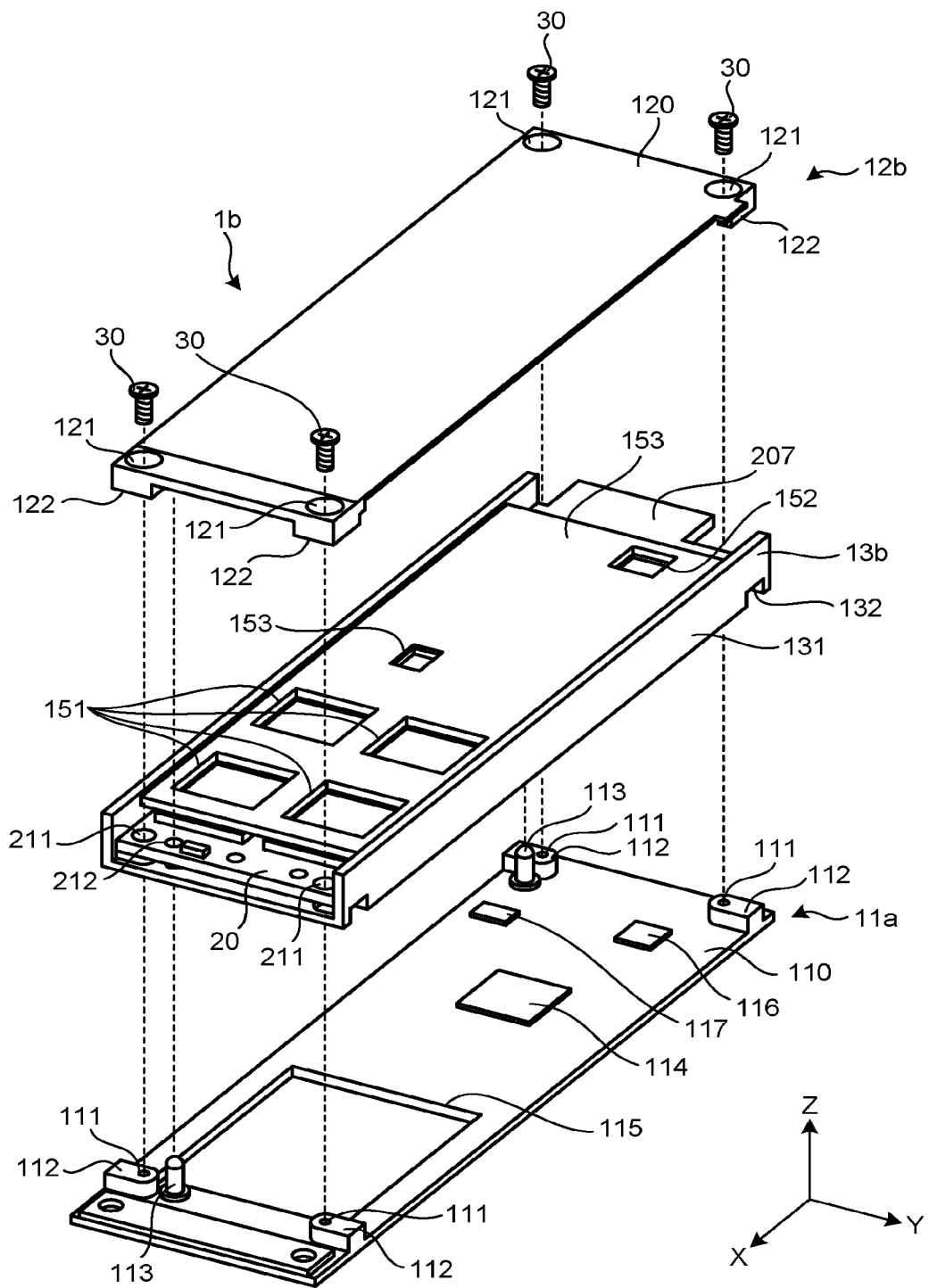
FIG. 12 is an exploded perspective view illustrating an example of a memory system of the third embodiment.
Figure 13:
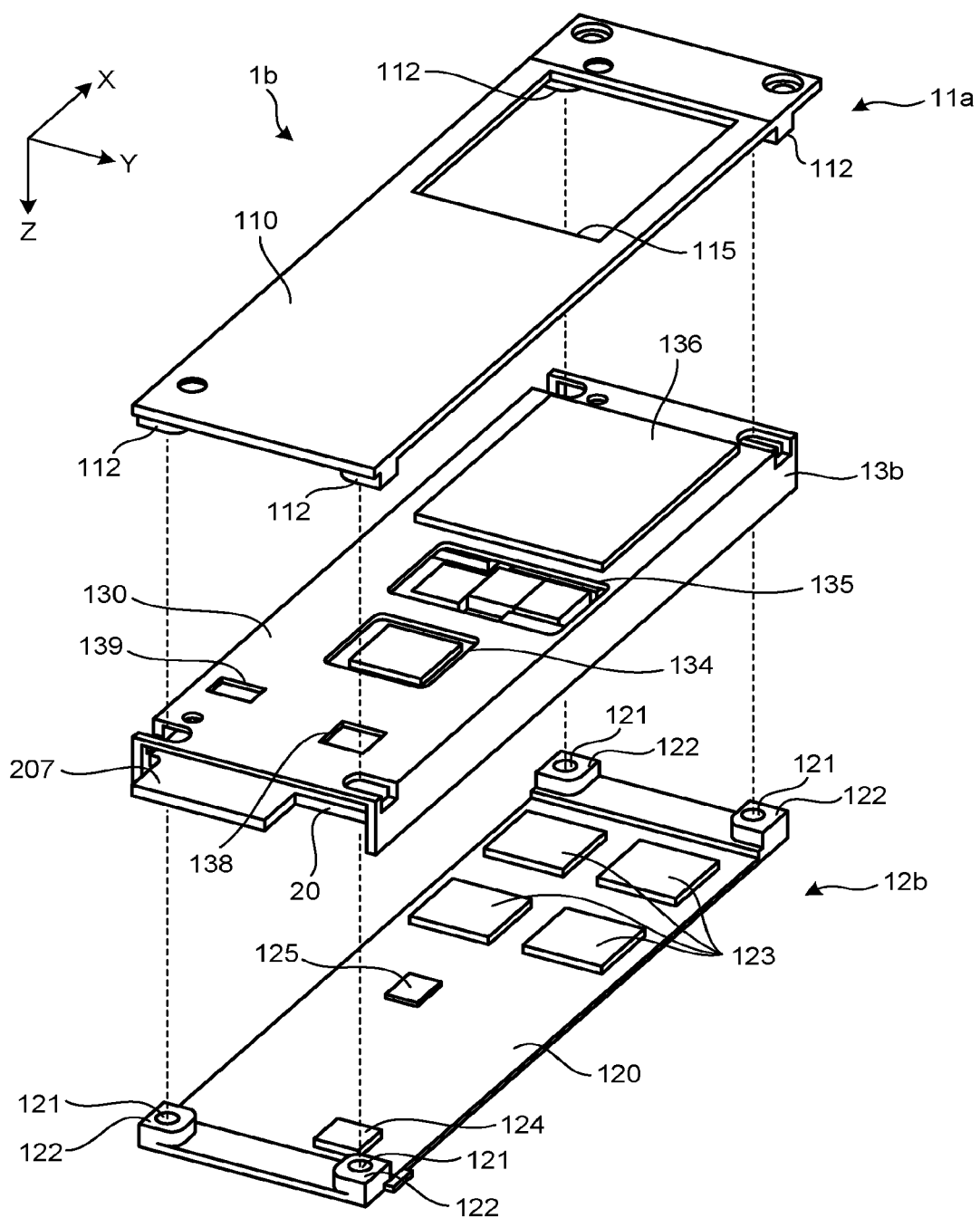
FIG. 13 is an external perspective view illustrating the example of the memory system of the third embodiment viewed from another viewpoint.
Figure 14:
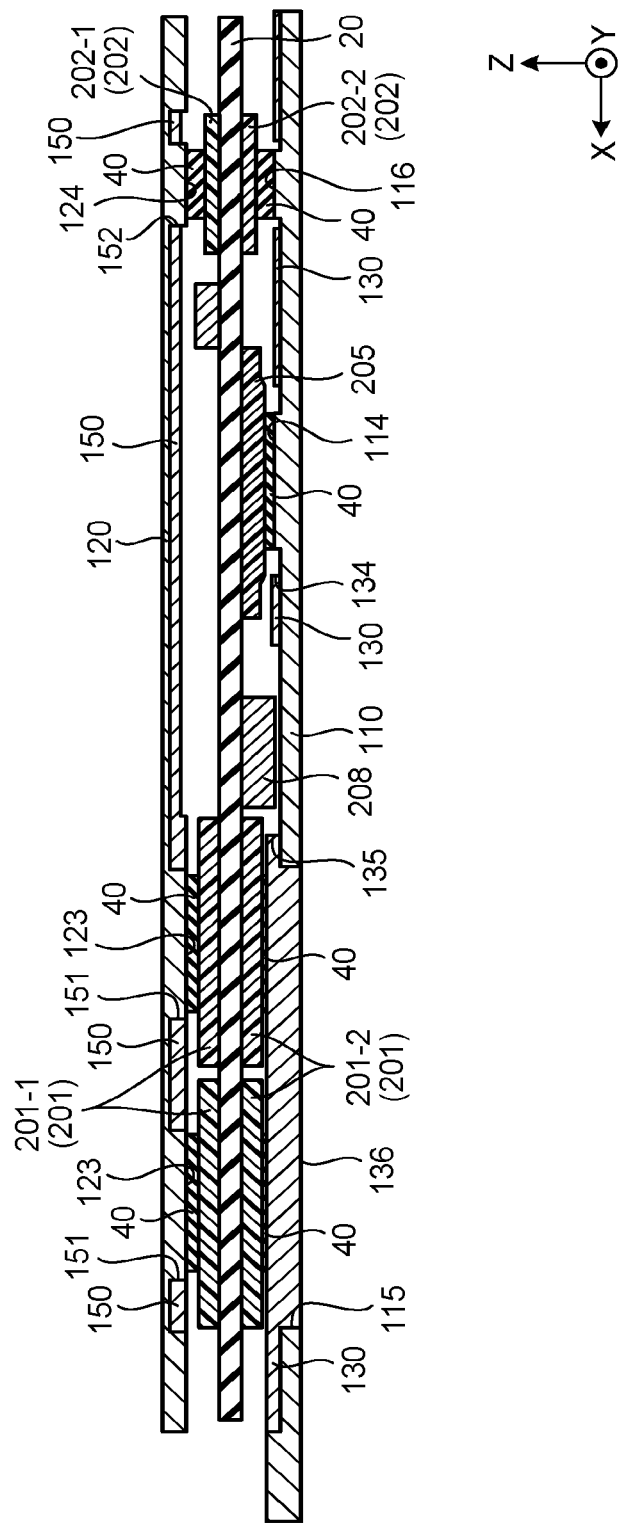
FIG. 14 is a cross-sectional view of the memory system of the third embodiment taken along the same cutting line as the cutting line A-A illustrated in FIG. 1.

FIG. 10 is a perspective view illustrating an example of an appearance of the intermediate member 13b of the third embodiment. FIG. 11 is a perspective view illustrating the example of the appearance of the intermediate member 13b of the third embodiment viewed from another viewpoint. FIG. 12 is an exploded perspective view illustrating an example of the memory system 1b of the third embodiment. FIG. 13 is an exploded perspective view illustrating the example of the memory system 1b of the third embodiment viewed from another viewpoint. FIG. 14 is a cross-sectional view of the memory system 1b of the third embodiment taken along the same cutting line as the cutting line A-A illustrated in FIG. 1. Note that the same constituent elements as those of the first embodiment will be denoted by the same reference signs, and the description thereof will be omitted. In addition, the same constituent elements as those in the second embodiment will be denoted by the same reference signs, and the description thereof will be omitted.

As illustrated in FIG. 10, the intermediate member 13b of the third embodiment is different from the intermediate member 13a of the second embodiment in that, an inner cover 150 to connect the pair of side walls 131 in the vicinity of upper ends of the pair of side walls 131 is provided. A tubular structure is formed by the second plate 130, the pair of side walls 131, and the inner cover 150. The substrate 20 is placed in the inner side of the tubular structure. The inner cover 150 is covered with the cover 12b from above. Note that the inner cover 150 is an example of a fourth plate.

The intermediate member 13b includes the inner cover 150, so that the area of the intermediate member 13b is larger than the area of the intermediate member 13a of the second embodiment. Therefore, diffusion of heat conducted to the entire intermediate member 13b from the non-volatile memory package 201-2 to the second plate 130 of the intermediate member 13b is accelerated. As a result, the heat generated in the non-volatile memory package 201-2 can be dissipated more efficiently.

As illustrated in FIG. 10, openings 151 are provided in the inner cover 150 at four positions respectively corresponding to the four non-volatile memory packages 201-1. In addition, as illustrated in FIG. 13, protrusions 123 protruding in the —Z direction are provided on the lower surface of the third plate 120 of the cover 12b at four positions which respectively correspond to the four non-volatile memory packages 201-1. As illustrated in FIG. 14, the four thermal conductive sheets 40 provided on the four non-volatile memory packages 201-1 are in contact with lower ends of the protrusions 123 through the openings 151, respectively. Therefore, heat generated in each of the four non-volatile memory packages 201-1 is conducted to the cover 12b through the thermal conductive sheet 40 and the protrusion 123, and is dissipated from the cover 12b to the outside. Note that the opening 151 is an example of a third opening.

As illustrated in FIG. 10, an opening 152 is provided in the inner cover 150 at a position corresponding to the volatile memory package 202-1. In addition, as illustrated in FIG. 13, a protrusion 124 protruding in the −Z direction is provided on the lower surface of the third plate 120 of the cover 12b at a position which corresponds to the volatile memory package 202-1. As illustrated in FIG. 14, the thermal conductive sheet 40 provided on the volatile memory package 202-1 is in contact with the lower end of the protrusion 124 through the opening 152. Therefore, the heat generated in the volatile memory package 202-1 is conducted to the cover 12b through the thermal conductive sheet 40 and the protrusion 124, and is dissipated from the cover 12b to the outside.

As illustrated in FIG. 10, an opening 153 is provided in the inner cover 150 at a position corresponding to the PMIC 203. In addition, as illustrated in FIG. 13, a protrusion 125 protruding in the −Z direction is provided on the lower surface of the third plate 120 of the cover 12b at a position which corresponds to the PMIC 203. The thermal conductive sheet 40 provided on the PMIC 203 is in contact with the lower end of the protrusion 125 through the opening 153. Therefore, heat generated in the PMIC 203 is conducted to the cover 12b through the thermal conductive sheet 40 and the protrusion 125, and is dissipated from the cover 12b to the outside.

In this manner, according to the third embodiment, the inner cover 150 is provided between the pair of side walls 131 of the intermediate member 13b. The second plate 130, the pair of side walls 131, and the inner cover 150 form the tubular structure that places the substrate 20 in the inner side.

Therefore, the diffusion of the heat generated in the non-volatile memory package 201-2 is accelerated, and thus, the heat generated in the non-volatile memory package 201-2 can be dissipated more efficiently.

In addition, the opening 151 is provided in the inner cover 150 at the position corresponding to the non-volatile memory package 201-1, and the non-volatile memory package 201-1 is thermally connected to the third plate 120 of the cover 12b through the opening 151 in the third embodiment.

Therefore, the heat generated in the non-volatile memory package 201-1 can be efficiently dissipated similarly to the first embodiment.

As described above, according to the first to third embodiments, the second plate 130 of the intermediate member 13, 13a, or 13b is placed to have the gap 50 with respect to the first plate 110. The second plate 130 is provided with the opening 134. The substrate 20, on which the non-volatile memory package 201-2 and the controller package 205 are mounted on the lower surface, is placed between the pair of side walls 131 of the intermediate member 13, 13a, or 13b. The non-volatile memory package 201-2 is thermally connected to the second plate 130 via the thermal conductive sheet 40. The controller package 205 is thermally connected to the first plate 110 via the thermal conductive sheet 40 through the opening 134.

Therefore, the heat generated in the non-volatile memory package 201 can be efficiently dissipated. Therefore, the execution of the thermal throttling can be suppressed and as a result, the performance of the memory system 1 can be improved.

Note that, in the first to third embodiments, elements such as the non-volatile memory package 201 and the controller package 205 are thermally connected to the base 11, the cover 12, or the intermediate member 13 via the thermal conductive sheet 40. A method of thermally connecting the element to the base 11, the cover 12, or the intermediate member 13 is not limited to the method using the thermal conductive sheet 40. The element may be thermally connected to the base 11, the cover 12, or the intermediate member 13 by directly bringing the surface of the element in contact with the base 11, the cover 12, or the intermediate member 13. Here, for example, two solids are thermally connected when a path of heat conduction is formed by contacting the two solids.

According to the first to third embodiments, the intermediate member 13, 13a, or 13b is arranged between the base 11 or 11a and the cover 12 or 12b, and the substrate 20 is placed in the intermediate member 13, 13a, or 13b. Arrangement of a heat dissipation path of heat generated in each of the elements can be implemented, for each element, by introducing the intermediate members 13, 13a, and 13b. In the description of the first to third embodiments, a path for dissipating heat generated in each of the elements is formed by contacting solids. The intermediate members 13, 13a, and 13b can enable installation of a heat-dissipation accelerating member. The heat-dissipation accelerating member includes a heat transport member such as a heat pipe, a member for expanding heat transfer surface such as a heat sink, a latent heat storage material made of a phase change material (PCM), or a small fan, in addition to the thermal conductive sheet 40. The memory systems 1, 1a, and 1b may be configured such that heat generated in some of or all the multiple elements including the non-volatile memory package 201 and the controller package 205 is dissipated via these heat-dissipation accelerating members. In this manner, by introducing the intermediate members 13, 13a, and 13b, it is possible to increase the degree of freedom in mounting the heat-dissipation accelerating member.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a first plate;
   an intermediate member that includes a second plate and a pair of side walls, the second plate being different from the first plate, the second plate including a first opening, the second plate being arranged to have a gap with respect to the first plate, the second plate including a first face facing the first plate and a second face located on a side opposite to the first face, the pair of side walls extending from the second face in a first direction, the first direction being a direction from the first face to the second face; and
   a substrate that is placed between the pair of side walls in a second direction that is perpendicular to the first direction, the substrate including a third face on which both a first non-volatile memory package containing a first non-volatile memory chip and a controller package containing a controller chip for controlling the first non-volatile memory chip are mounted, the third face facing the second plate, wherein
   the controller package is in touch with the first plate through the first opening, and
   the first non-volatile memory package is in touch with the second plate that includes the first opening through which the controller package is in touch with the first plate.

2. The memory system according to claim 1, wherein
   each side wall of the pair of side walls of the intermediate member includes a notched part,
   the first plate includes first protrusions, and
   the first plate and the intermediate member abut on each other at the notched part of each side wall and a corresponding one of the first protrusions.

3. The memory system according to claim 1, wherein the first plate includes a second opening provided at a position corresponding to the first non-volatile memory package.

4. The memory system according to claim 2, wherein the first plate includes a second opening provided at a position corresponding to the first non-volatile memory package.

5. The memory system according to claim 3, wherein
   the second plate includes a second protrusion provided at a position on the first face corresponding to the first non-volatile memory package,
   the second protrusion protrudes through an inner side of the second opening, and
   an end surface of the second protrusion is flush with a second surface of the first plate, the second surface of the first plate is located on a side opposite to a first surface of the first plate, the first surface of the first plate facing the second plate.

6. The memory system according to claim 4, wherein
   the second plate includes a second protrusion provided at a position on the first face corresponding to the first non-volatile memory package,
   the second protrusion protrudes through an inner side of the second opening, and
   an end surface of the second protrusion is flush with a second surface of the first plate, the second surface of the first plate is located on a side opposite to a first surface of the first plate, the first surface of the first plate facing the second plate.

7. The memory system according to claim 1, further comprising a third plate that covers a fourth face of the substrate, the fourth face is on a side opposite to the third face,
   wherein, on the fourth face of the substrate, a second non-volatile memory package containing a second non-volatile memory chip controlled by the controller chip is mounted, the second non-volatile memory package being in touch with the third plate.

8. The memory system according to claim 2, further comprising a third plate that covers a fourth face of the substrate, the fourth face is on a side opposite to the third face,
   wherein, on the fourth face of the substrate, a second non-volatile memory package containing a second non-volatile memory chip controlled by the controller chip is mounted, the second non-volatile memory package being in touch with the third plate.

9. The memory system according to claim 3, further comprising a third plate that covers a fourth face of the substrate, the fourth face is on a side opposite to the third face,
   wherein, on the fourth face of the substrate, a second non-volatile memory package containing a second non-volatile memory chip controlled by the controller chip is mounted, the second non-volatile memory package being in touch with the third plate.

10. The memory system according to claim 4, further comprising a third plate that covers a fourth face of the substrate, the fourth face is on a side opposite to the third face,
wherein, on the fourth face of the substrate, a second non-volatile memory package containing a second non-volatile memory chip controlled by the controller chip is mounted, the second non-volatile memory package being in touch with the third plate.

11. The memory system according to claim 5, further comprising a third plate that covers a fourth face of the substrate, the fourth face is on a side opposite to the third face,
wherein, on the fourth face of the substrate, a second non-volatile memory package containing a second non-volatile memory chip controlled by the controller chip is mounted, the second non-volatile memory package being in touch with the third plate.

12. The memory system according to claim 6, further comprising a third plate that covers a fourth face of the substrate, the fourth face is on a side opposite to the third face,
wherein, on the fourth face of the substrate, a second non-volatile memory package containing a second non-volatile memory chip controlled by the controller chip is mounted, the second non-volatile memory package being in touch with the third plate.

13. The memory system according to claim 7, further comprising a fourth plate that is provided between the pair of side walls of the intermediate member, wherein
the second plate, the pair of side walls, and the fourth plate form a tubular structure,
the substrate is placed in an inner side of the tubular structure,
the third plate covers the fourth plate, and
the fourth plate covers the fourth face of the substrate.

14. The memory system according to claim 13, wherein
the fourth plate includes a third opening provided at a position corresponding to the second non-volatile memory package, and
the second non-volatile memory package is in touch with the third plate through the third opening.

15. The memory system according to claim 7, wherein the first non-volatile memory package and the second non-volatile memory package are mounted at positions corresponding to each other on the substrate.

16. The memory system according to claim 8, wherein the first non-volatile memory package and the second non-volatile memory package are mounted at positions corresponding to each other on the substrate.

17. The memory system according to claim 9, wherein the first non-volatile memory package and the second non-volatile memory package are mounted at positions corresponding to each other on the substrate.

18. The memory system according to claim 13, wherein the first non-volatile memory package and the second non-volatile memory package are mounted at positions corresponding to each other on the substrate.

19. The memory system according to claim 14, wherein the first non-volatile memory package and the second non-volatile memory package are mounted at positions corresponding to each other on the substrate.

20. The memory system according to claim 1, wherein the first non-volatile memory package is in contact with the second plate through a thermal conductive sheet, and the controller package is in contact with the first plate through a second thermal conductive sheet.

21. The memory system according to claim 1, wherein the gap separates a heat dissipation path of heat generated from the controller package and a heat dissipation path of heat generated from the first non-volatile memory package.

22. A memory system comprising:
a first plate including a second opening provided at a position corresponding to a first non-volatile memory package;
an intermediate member that includes a second plate and a pair of side walls, the second plate including a first opening, the second plate being arranged to have a gap with respect to the first plate, the second plate including a first face facing the first plate and a second face located on a side opposite to the first face, the pair of side walls being arranged on the second face, the second plate including a second protrusion provided at a position on the first face corresponding to the first non-volatile memory package; and
a substrate that is placed between the pair of side walls, the substrate including a third face on which both the first non-volatile memory package containing a first non-volatile memory chip and a controller package containing a controller chip for controlling the first non-volatile memory chip are mounted, the third face facing the second plate, wherein
the first non-volatile memory package is thermally connected to the second plate,
the controller package is thermally connected to the first plate through the first opening,
the second protrusion protrudes through an inner side of the second opening, and
an end surface of the second protrusion is flush with a second surface of the first plate, the second surface of the first plate is located on a side opposite to a first surface of the first plate, the first surface of the first plate facing the second plate.

23. The memory system according to claim 22, further comprising a third plate that covers a fourth face of the substrate, the fourth face is on a side opposite to the third face.

24. The memory system according to claim 22, further comprising a third plate that covers a fourth face of the substrate, the fourth face is on a side opposite to the third face,
wherein, on the fourth face of the substrate, a second non-volatile memory package containing a second non-volatile memory chip controlled by the controller chip is mounted, the second non-volatile memory package being thermally connected to the third plate.

25. The memory system according to claim 24, wherein the first non-volatile memory package and the second non-volatile memory package are mounted at positions corresponding to each other on the substrate.

26. A memory system comprising:
a first plate;
an intermediate member that includes a second plate and a pair of side walls, the second plate including a first opening, the second plate being arranged to have a gap with respect to the first plate, the second plate including a first face facing the first plate and a second face located on a side opposite to the first face, the pair of side walls being arranged on the second face, the pair of side walls extending from the second plate;

a substrate that is placed between the pair of side walls, the substrate including a third face on which both a first non-volatile memory package containing a first non-volatile memory chip and a controller package containing a controller chip for controlling the first non-volatile memory chip are mounted, the third face facing the second plate;

a third plate that covers a fourth face of the substrate, the fourth face is on a side opposite to the third face; and a fourth plate that is provided between the pair of side walls of the intermediate member, the fourth plate that covers the fourth face of the substrate, wherein the first non-volatile memory package is thermally connected to the second plate, the controller package is thermally connected to the first plate through the first opening, on the fourth face of the substrate, a second non-volatile memory package containing a second non-volatile memory chip controlled by the controller chip is mounted, the second non-volatile memory package being thermally connected to the third plate, the second plate, the pair of side walls, and the fourth plate form a tubular structure, the substrate is placed in an inner side of the tubular structure, and the third plate covers the fourth plate.

27. The memory system according to claim 26, wherein
the fourth plate includes a third opening provided at a position corresponding to the second non-volatile memory package, and the second non-volatile memory package is thermally connected to the third plate through the third opening.

28. The memory system according to claim 26, wherein the first non-volatile memory package and the second non-volatile memory package are mounted at positions corresponding to each other on the substrate.

29. The memory system according to claim 27, wherein the first non-volatile memory package and the second non-volatile memory package are mounted at positions corresponding to each other on the substrate.

* * * * *